United States Patent
Sparkman

(10) Patent No.: US 6,922,062 B2
(45) Date of Patent: Jul. 26, 2005

(54) TIMING MARKERS FOR THE MEASUREMENT AND TESTING OF THE CONTROLLED IMPEDANCE OF A CIRCUIT BOARD

(75) Inventor: Aubrey K. Sparkman, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 83 days.

(21) Appl. No.: 10/335,779

(22) Filed: Jan. 2, 2003

(65) Prior Publication Data

US 2004/0130334 A1 Jul. 8, 2004

(51) Int. Cl.[7] .............................................. G01R 27/04
(52) U.S. Cl. ...................................... 324/644; 324/537
(58) Field of Search ................................. 324/644, 642, 324/533, 537

(56) References Cited

U.S. PATENT DOCUMENTS 5,502,392 A * 3/1996 Arjavalingam et al. ..... 324/642
6,384,706 B1 * 5/2002 Iwanami ..................... 336/200
6,420,878 B1 * 7/2002 Boorom ...................... 324/533
6,670,816 B2 * 12/2003 Kim et al. ................... 324/535
6,714,021 B2 * 3/2004 Williams .................... 324/533

OTHER PUBLICATIONS

IPC–TM–650 Test Methods Manual Characteristic Impedance and Time Delay of Lines on Printed Boards by TDR.

* cited by examiner

Primary Examiner—Anjan Deb
Assistant Examiner—Timothy J. Dole
(74) Attorney, Agent, or Firm—Baker Botts L.L.P.

(57) ABSTRACT

Testing of a printed circuit board (PCB) impedance measurement region is performed using time domain reflectometry (TDR) that measures reflections and time delays of pulses injected into an impedance measurement region (impedance coupon). Timing markers are used to give both visual and electrical indications of precisely where the desired impedance measurement region (impedance coupon) begins and ends. The timing markers are placed on either end of the impedance coupon to be measured and give explicit start and end points to the PCB impedance measurement region. The timing markers may be in any form which has a discernable impedance difference from the PCB impedance measurement region.

12 Claims, 6 Drawing Sheets

TIMING MARKERS FOR THE MEASUREMENT AND TESTING OF THE CONTROLLED IMPEDANCE OF A CIRCUIT BOARD

BACKGROUND OF THE INVENTION TECHNOLOGY

1. Field of the Invention

The present invention is related to printed circuit board testing, and more specifically, to the measurement and testing of a printed circuit board's controlled impedance.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as computers and associated storage disk arrays use high speed data and control buses comprising a plurality of printed circuit traces or conductors on a printed circuit board (PCB) over which high speed (fast rise and fall time) signals, e.g., electrical pulses, travel between the electronic circuits, e.g., microprocessor, memory, programmable logic array (PLA), application specific integrated circuit (ASIC), serial and parallel interfaces and the like, mounted on the printed circuit board. It is important that these printed circuit traces have a controlled impedance so as to minimize degradation of the high speed signals, e.g., noise, reflections, crosstalk, skewing and the like. Therefore it is important to verify the quality of PCB construction by testing and measuring the impedance of the printed circuit board traces, and the quality and uniformity of the dielectric value of the material comprising the insulated portion of the PCB.

Impedance coupons are used to check the quality of PCB construction. For high performance PCB's, it is necessary for the electrical impedance to be controlled, such that all data buses function within specification. Impedance of individual PCB traces can vary depending on many factors, e.g., trace width and thickness, dielectric constant of the PCB material. As a quality inspection tool, impedance coupons may be added to the PCB design. The impedance coupons may be conductive traces on the PCB of a approximately 6 inches in length and may be adapted where a time domain reflectometer can be used to measure the impedance of the conductive traces. Being able to easily and reliably measure the impedance coupon can directly affect determining the yield of the PCB, thus better impedance measurement techniques help ensure cost effective production of the high performance PCBs without unnecessary waste and error by miss-measuring good PCBs or erroneously accepting defective PCBs.

The PCB must be tested by measuring the controlled impedance to determine if the required controlled impedance specification is met. However, using standard test and measurement equipment, it can be difficult to assess where to begin or end the measurement of an impedance coupon.

SUMMARY OF THE INVENTION

The present invention remedies the shortcomings of the prior art by providing an apparatus, system, and method for reliably measuring and testing the controlled impedance of a PCB using standard test and measurement equipment.

In the present invention, a PCB of an information handling system has timing markers that give both visual and electrical indications of precisely where the desired impedance measurement region (impedance coupon) begins and ends. The timing markers have a different impedance value, either higher or lower, than the PCB impedance coupon to be measured. Therefore, by placing timing markers on the impedance coupon, one can visually see on the PCB the measurement region, and when impedance is measured in production, the different characteristic impedance value(s) of the markers give the explicit start and end points to the PCB impedance measurement region.

The timing markers may be in any form which has a discernable impedance difference from the PCB impedance measurement region. The timing markers may be for example, but are not limited to: vias, widened regions, narrowed regions, changes in pattern, changes in direction, changes is shape and the like. A first timing marker is located between a test connection point and proximate to the beginning of the PCB impedance measurement region. A second timing marker is located proximate to the end of the PCB impedance measurement region. The first and second timing markers thereby give clear visual and electrical indications of the beginning and end points of the PCB impedance measurement region. In effect, the timing markers function as known impedance discontinuities of the impedance measurement region.

Testing of the PCB impedance measurement region, generally, is performed using time domain reflectometry (TDR) that measures reflections and time delays of pulses injected into a transmission line. Discontinuities in characteristic impedance, Zo, along a transmission line under test reflect portions of incident pulses back toward the pulse source where they combine with the injected pulse to produce a voltage-time waveform. Knowing the locations of the discontinuities (timing markers), the observed times for corresponding voltage changes in the pulse waveform may be used in determining the time delay of the pulses. Pulse time delay is related to the effective permittivity of the PCB dielectric and the transmission line structure.

Manufacturing control testing is performed to identify and correct process or materials problems occurring during a manufacturing run as well as to assure that a PCB will perform electrically as designed. Examples of PCB parameter variations detectable by TDR measurements, and are evidence of process or materials problems, include but are not limited to: over/under etching (line width problems), over/under plating (line width and thickness problems), permittivity of the PCB dielectric, thickness variation of the dielectric, residues from process steps including cleaning, degradation from excessive heating and humidity, and damage from excessive pressure during lamination of the PCB multi-layer process. Non-destructive determination of the effective relative dielectric constant of the PCB substrate material may be determined by accurately knowing the distance between timing markers and the time a signal takes to travel that distance.

A technical advantage of the present invention is ease in the setup and testing of the signal handling quality of a PCB. Another technical advantage is more uniformity in the measured data when testing PCBs. Another technical advantage is better accuracy and uniformity in measuring PCB trace impedance. Still another technical advantage is non-destructively determining the effective relative dielectric constant of the PCB substrate material.

BRIEF DESCRIPTION OF THE DRAWINGS

A more complete understanding of the present disclosure and advantages thereof may be acquired by referring to the following description taken in conjunction with the accompanying drawings wherein:

FIG. 4 is a schematic orthogonal view of the exemplary embodiment illustrated in FIG. 3a;

Figure 1:
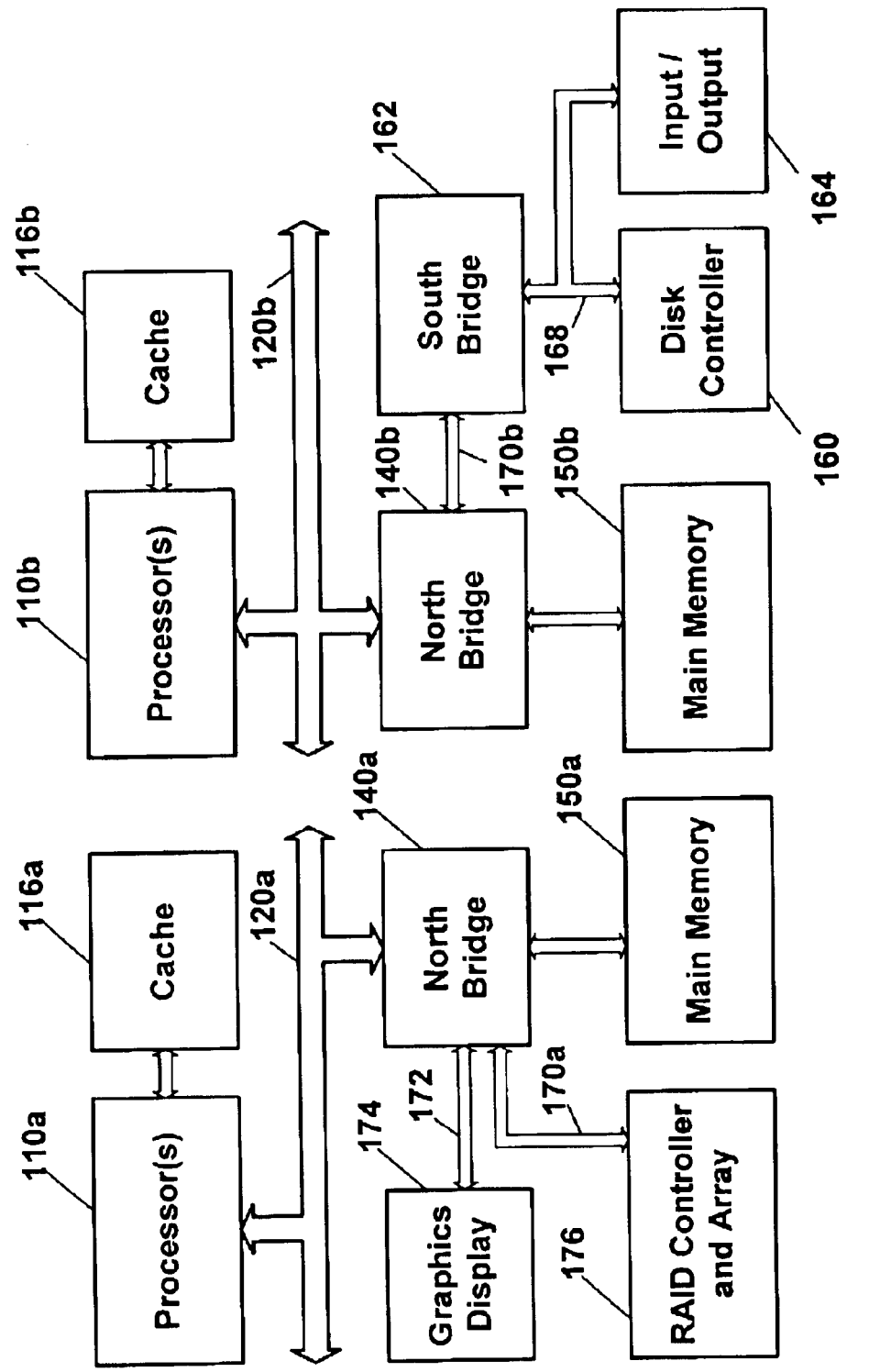
FIG. 1 is a schematic block diagram of an exemplary embodiment of an information handling system.

The present invention may be susceptible to various modifications and alternative forms. Specific exemplary embodiments thereof are shown by way of example in the drawing and are described herein in detail. It should be understood, however, that the description set forth herein of specific embodiments is not intended to limit the present invention to the particular forms disclosed. Rather, all modifications, alternatives, and equivalents falling within the spirit and scope of the invention as defined by the appended claims are intended to be covered.

DETAILED DESCRIPTION OF SPECIFIC EMBODIMENTS

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU), hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring now to the drawings, the details of exemplary embodiments of the present invention are schematically illustrated. Like elements in the drawings will be represented by like numbers, and similar elements will be represented by like numbers with a different lower case letter suffix.

Referring to FIG. 1, an information handling system is illustrated having electronic components mounted on at least one PCB and communicating data and control signals therebetween over signal buses which may be comprised of constant impedance electrical conductors. In one embodiment, the information handling system is a computer system. The information handling system, generally referenced by the numeral 100, comprises a processor(s) 110 coupled to a host bus(es) 120 and a cache memory 116. A north bridge(s) 140, which may also be referred to as a "memory controller hub" or a "memory controller," is coupled to a main system memory 150. The north bridge 140 is coupled to the system processor(s) 110 via the host bus(es) 120. The north bridge 140 is generally considered an application specific chip set that provides connectivity to various buses, and integrates other system functions such as memory interface. For example, an Intel 820E and/or 815E chip set, available from the Intel Corporation of Santa Clara, Calif., provides at least a portion of the north bridge 140. The chip set may also be packaged as an application specific integrated circuit ("ASIC"). The north bridge 140 typically includes functionality to couple the main system memory 150 to other devices within the information handling system 100. Thus, memory controller functions such as main memory control functions typically reside in the north bridge 140. In addition, the north bridge 140 provides bus control to handle transfers between the host bus 120 and a second bus, e.g., PCI bus 170, AGP bus 172 (coupled to graphics display 174), etc. The second bus may also include other industry standard buses or proprietary buses, e.g., ISA, SCSI, USB buses 168 through a south bridge (bus interface) 162. These secondary buses 168 may have their own interfaces and controllers, e.g., ATA disk controller 160 and input/output interface(s) 164.

In the information handling system 100, according to the present invention, a PCB(s) is used to mount and electrically interconnect the aforementioned electronic components. High speed digital circuits require constant impedance signal paths that meet expected design specifications, otherwise malfunction and/or unreliable operation of the information handling system 100 may occur. To insure consistent and quality PCBs for construction of the information handling system 100, the present invention may be used to easily and quickly measure and verify whether the controlled impedance of circuit conductors on the PCB meet required manufacturing specifications.

Figure 2:
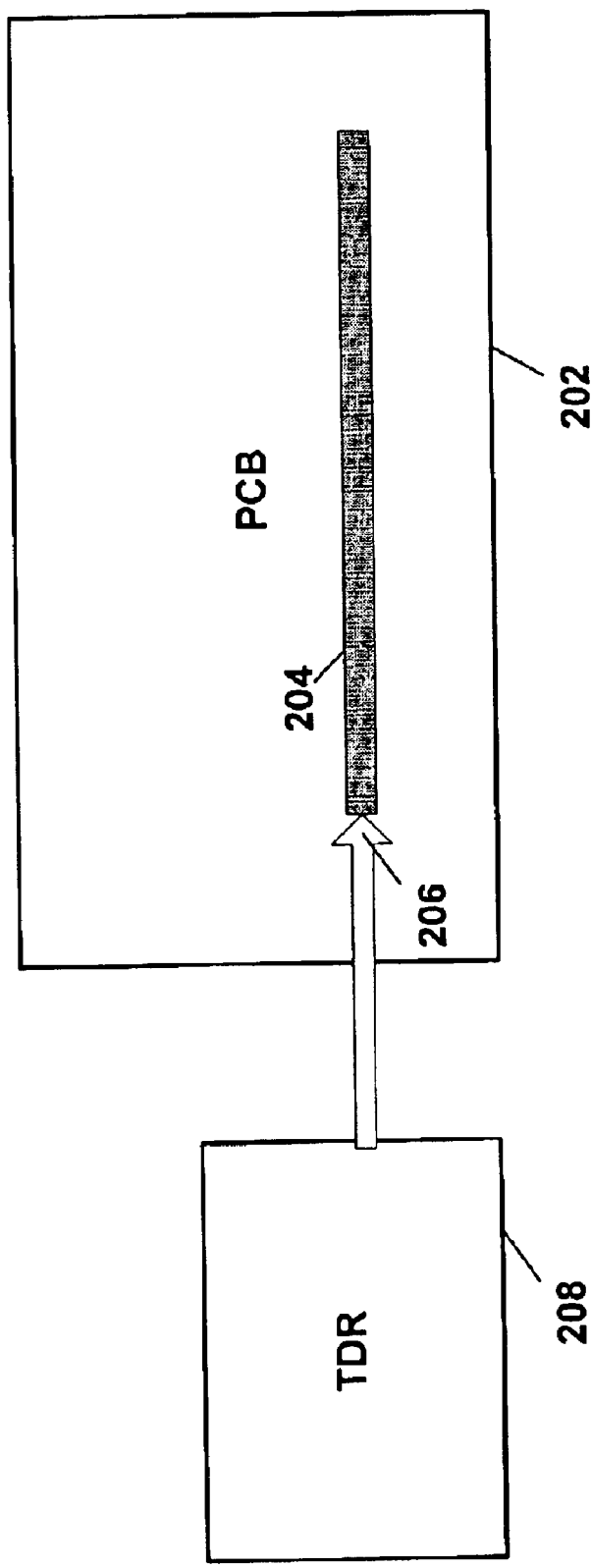
FIG. 2 is a simplified schematic block diagram illustrating a time domain reflectometry (TDR) test setup.

Referring now to FIG. 2, depicted is a simplified schematic block diagram of a time domain reflectometry (TDR) test setup. A PCB 202 has an impedance measurement region or impedance coupon 204 that is being measured by a TDR tester 208. The TDR tester 208 is coupled to the impedance coupon 204 with a test probe 206. A more complete description of TDR testing may be found in the IPC-TM-650 Test Methods Manual (Characteristic Impedance and Time Delay of Lines on Printed Boards by TDR), published by the Institute for Interconnecting and Packaging Electronic Circuits, 2215 Sanders Road, Northbrook, Ill. 60062, and is incorporated by reference herein. A problem inherent in TDR testing is where does the test region begin and end. The present invention solves this problem.

Figure 3A:
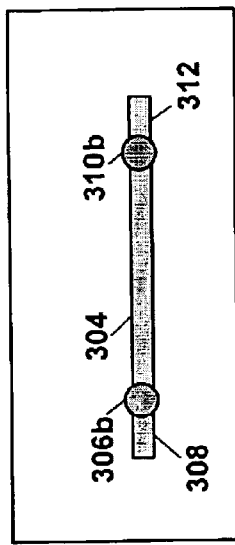
FIGS. 3a–3d are schematic block diagrams of specific exemplary embodiments of the present invention.

Referring to FIGS. 3a–3d, depicted are schematic block diagrams of specific exemplary embodiments of the present invention. FIG. 3a illustrates a PCB 202 having a printed circuit conductor comprising a first portion 308, and first timing via 306a, an impedance measurement region (impedance coupon) 304, a second timing via 310a, and a second portion 312. FIG. 4 depicts a schematic orthogonal view of a multi-layer PCB 202 having the aforementioned printed circuit conductor illustrated in FIG. 3a. The TDR tester 208 may be coupled with the test probe 206 (FIG. 2) to the printed conductor at either the first portion 308 or the second portion 312.

Figure 5:
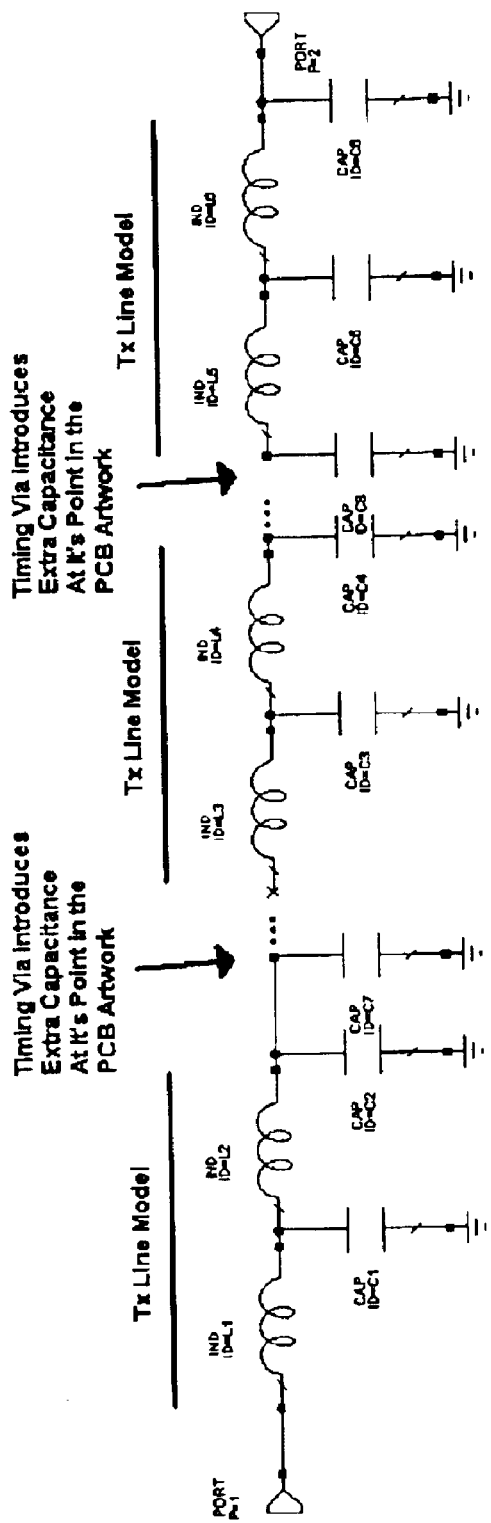
FIG. 5 is a theoretical equivalent circuit diagram of how the timing vias cause disruptions in the standard transmission line model, according to the present invention.
Figure 6:
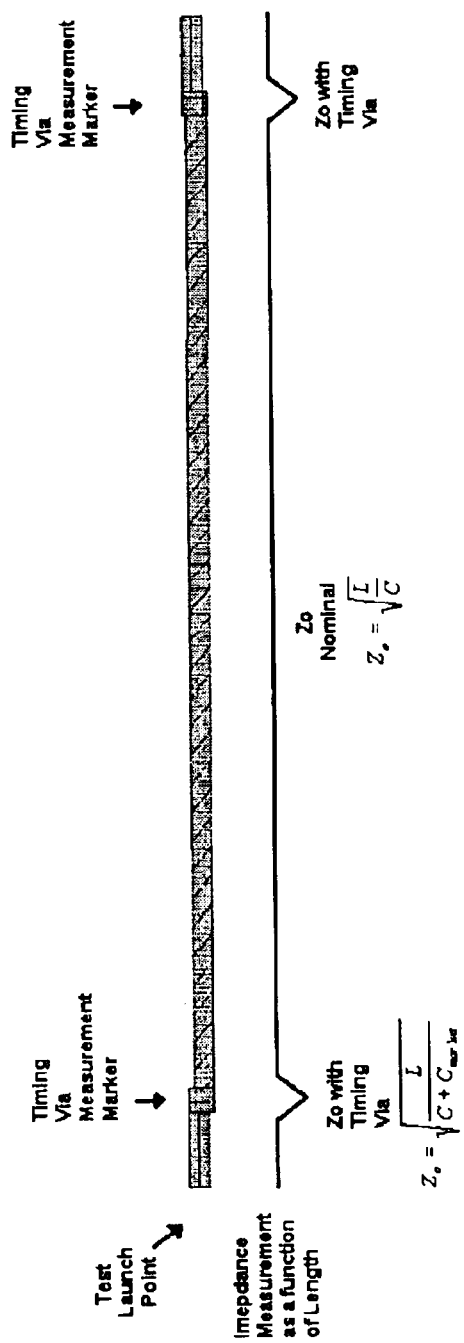
FIG. 6 illustrates typical effects of measured impedance as a function of length, according to the present invention.

The first and second timing vias, 306a and 310a, give both a visual and electrical markers that determine precisely where the impedance measurement region 304 begins and ends. PCB Vias tend to have a different impedance value (e.g., higher or lower) than a typical routed PCB conductive trace. Therefore, by placing timing vias 306a and 310a on each end of the impedance measurement region (impedance coupon) 304, one can visually see on the PCB 202 the impedance measurement region (impedance coupon) 304, and when impedance is measured by the TDR 208 during production testing, the characteristic change in impedance values of the vias 306a and 310a give the explicit beginning and end points to the PCB 202 impedance measurement region (impedance coupon) 304. FIG. 5 illustrates a theoretical equivalent circuit diagram of how the timing vias cause disruptions in the standard transmission line model. FIG. 6 depicts typical effects of measured impedance as a function of length. Therefor the timing via markers may be used to designate where the measurement begins for Zo nominal test and where it ends and how the measurement impedance will change with respect to the physical structure of the printed circuit conductor.

Figure 3B:
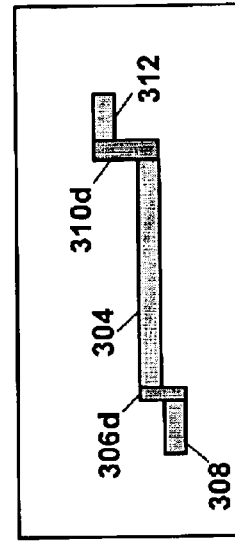
Figure 4:
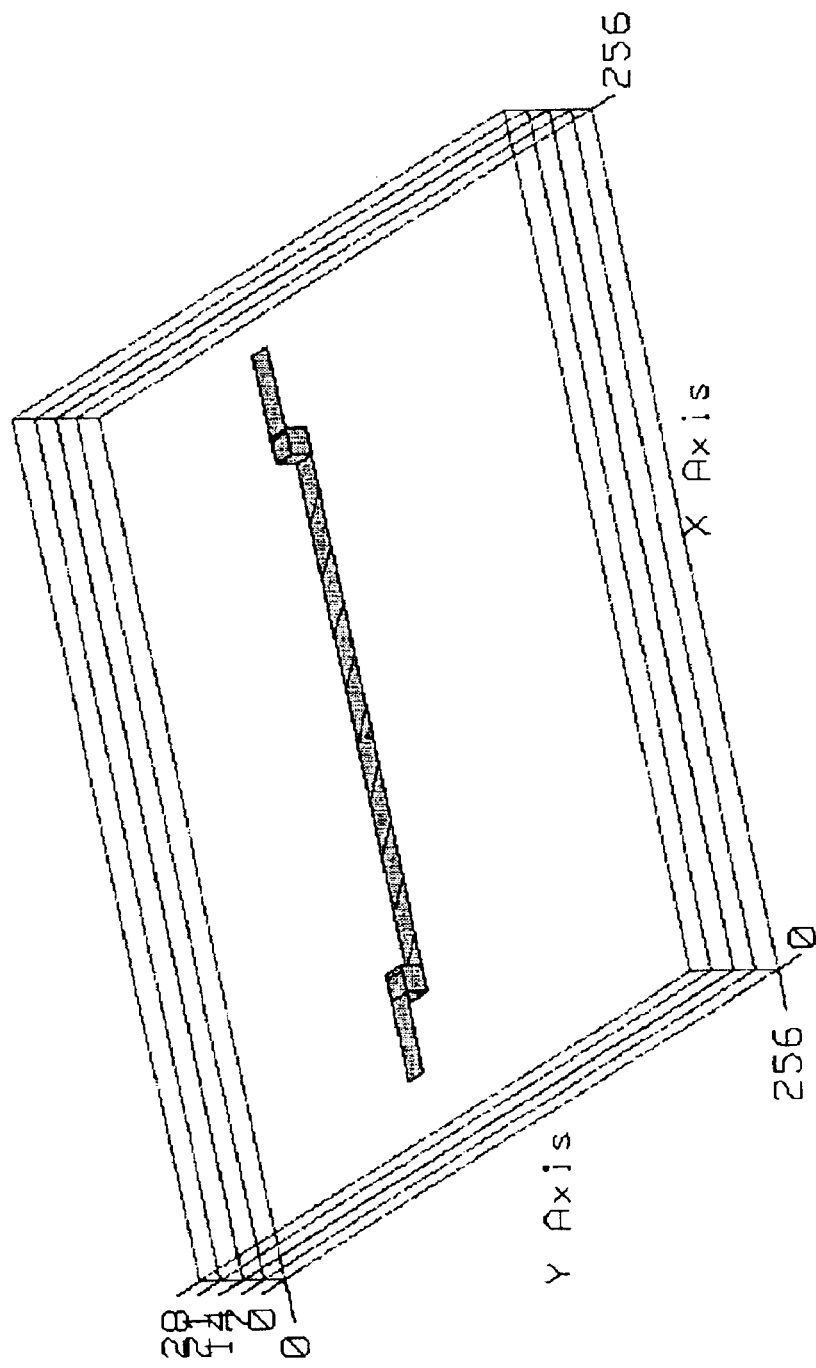

FIG. 3b depicts another exemplary embodiment of the invention having widened regions 306b and 310b on either end of the impedance measurement region (impedance coupon) 304. The first portion 308 and second portion 312 are coupled to the impedance measurement region (impedance coupon) 304 through widened regions 306b and 310b. The widened regions 306b and 310b have a different impedance than the impedance measurement region (impedance coupon) 304 and thereby define, both visually and electrically, precisely where the impedance measurement region 304 begins and ends. Thus, the widened regions 306b and 310b may be used as timing markers.

Figure 3C:
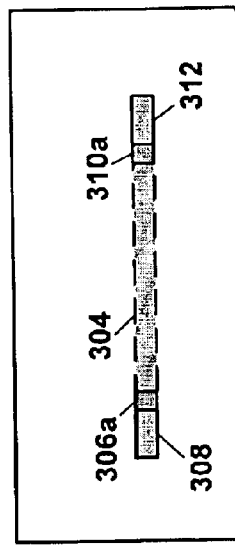

FIG. 3c depicts yet another exemplary embodiment of the invention having narrowed regions 306c and 310c on either end of the impedance measurement region (impedance coupon) 304. The first portion 308 and second portion 312 are coupled to the impedance measurement region (impedance coupon) 304 through the narrowed regions 306c and 310c. The narrowed regions 306c and 310c have a different impedance than the impedance measurement region (impedance coupon) 304 and thereby define, both visually and electrically, precisely where the impedance measurement region 304 begins and ends. Thus, the narrowed regions 306c and 310c may be used as timing markers.

Figure 3D:
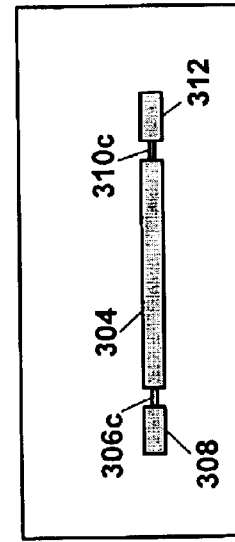

FIG. 3d depicts still another exemplary embodiment of the invention having offset regions 306d and 310d on either end of the impedance measurement region (impedance coupon) 304. The first portion 308 and second portion 312 are coupled to the impedance measurement region (impedance coupon) 304 through the narrowed regions 306c and 310c. The offset regions 306d and 310d have a different impedance than the impedance measurement region (impedance coupon) 304 and thereby define, both visually and electrically, precisely where the impedance measurement region 304 begins and ends. Thus, the offset regions 306d and 310d may be used as timing markers.

The dielectric constant of the PCB 202 substrate material may be determined, for example, by using the equation:

$$Er = C^2/(L/t)^2$$

Where Er is the effective relative dielectric constant, C is the speed of light in a vacuum, L is the distance between the two timing markers 306 and 310 or length of the conductive land between the two timing markers 306 and 310, and t is the time that a signal takes to travel from marker 306 to marker 310. Thus, the effective relative dielectric constant of the PCB substrate material may be measured non-destructively.

The invention, therefore, is well adapted to carry out the objects and to attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alteration, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An information handling system having a printed circuit board with timing markers defining an impedance measurement region, said system comprising:
   a printed circuit board;
   a controlled impedance conductor, the controlled impedance conductor being part of the printed circuit board and comprising,
      a first portion;
      a second portion;
      an impedance measurement region having first and second ends;
      a first timing marker; and
      a second timing marker;
      wherein the first timing marker is coupled between the first portion and the first end of the impedance measurement region, and the second timing marker is coupled between the second portion and the second end of the impedance measurement region;
      wherein the first and second timing markers have a different impedance than the impedance measurement region; and
      wherein the first and second timing markers have a lower impedance than the impedance measurement region.

2. An information handling system having a printed circuit board with timing markers defining an impedance measurement region, said system comprising:
   a printed circuit board;
   a controlled impedance conductor, the controlled impedance conductor being part of the printed circuit board and comprising, a first portion;
a second portion;
an impedance measurement region having first and second ends;
a first timing marker; and
a second timing marker;
wherein the first timing marker is coupled between the first portion and the first end of the impedance measurement region, and the second timing marker is coupled between the second portion and the second end of the impedance measurement region;
wherein the first and second timing markers have a different impedance than the impedance measurement region; and
wherein the first and second timing markers have a higher impedance than the impedance measurement region.

3. An information handling system having a printed circuit board with timing markers defining an impedance measurement region, said system comprising:
a printed circuit board;
a controlled impedance conductor, the controlled impedance conductor being part of the printed circuit board and comprising,
a first portion;
a second portion;
an impedance measurement region having first and second ends;
a first timing marker; and
a second timing marker;
wherein the first timing marker is coupled between the first portion and the first end of the impedance measurement region, and the second timing marker is coupled between the second portion and the second end of the impedance measurement region;
wherein the first and second timing markers have a different impedance than the impedance measurement region; and
wherein the first and second timing markers are substantially the same impedance.

4. An information handling system having a printed circuit board with timing markers defining an impedance measurement region, said system comprising:
a printed circuit board;
a controlled impedance conductor, the controlled impedance conductor being part of the printed circuit board and comprising,
a first portion;
a second portion;
an impedance measurement region having first and second ends;
a first timing marker; and
a second timing marker;
wherein the first timing marker is coupled between the first portion and the first end of the impedance measurement region, and the second timing marker is coupled between the second portion and the second end of the impedance measurement region;
wherein the first and second timing markers have a different impedance than the impedance measurement region; and
wherein the first and second timing markers are different impedance.

5. An information handling system having a printed circuit board with timing markers defining an impedance measurement region, said system comprising:
a printed circuit board;

a controlled impedance conductor, the controlled impedance conductor being part of the printed circuit board and comprising,
a first portion;
a second portion;
an impedance measurement region having first and second ends;
a first timing marker; and
a second timing marker;
wherein the first timing marker is coupled between the first portion and the first end of the impedance measurement region, and the second timing marker is coupled between the second portion and the second end of the impedance measurement region;
wherein the first and second timing markers have a different impedance than the impedance measurement region; and
wherein the first and second timing markers are widened regions.

6. An information handling system having a printed circuit board with timing markers defining an impedance measurement region, said system comprising:
a printed circuit board;
a controlled impedance conductor, the controlled impedance conductor being part of the printed circuit board and comprising,
a first portion;
a second portion;
an impedance measurement region having first and second ends;
a first timing marker; and
a second timing marker;
wherein the first timing marker is coupled between the first portion and the first end of the impedance measurement region, and the second timing marker is coupled between the second portion and the second end of the impedance measurement region;
wherein the first and second timing markers have a different impedance than the impedance measurement region; and
wherein the first and second timing markers are narrowed regions.

7. An information handling system having a printed circuit board with timing markers defining an impedance measurement region, said system comprising:
a printed circuit board;
a controlled impedance conductor, the controlled impedance conductor being part of the printed circuit board and comprising,
a first portion;
a second portion;
an impedance measurement region having first and second ends;
a first timing marker; and
a second timing marker;
wherein the first timing marker is coupled between the first portion and the first end of the impedance measurement region, and the second timing marker is coupled between the second portion and the second end of the impedance measurement region;
wherein the first and second timing markers have a different impedance than the impedance measurement region; and
wherein the first and second timing markers have a different pattern than the impedance measurement region.

8. An information handling system having a printed circuit board with timing markers defining an impedance measurement region, said system comprising:

a printed circuit board;
a controlled impedance conductor, the controlled impedance conductor being part of the printed circuit board and comprising,
a first portion;
a second portion;
an impedance measurement region having first and second ends;
a first timing marker; and
a second timing marker;
wherein the first timing marker is coupled between the first portion and the first end of the impedance measurement region, and the second timing marker is coupled between the second portion and the second end of the impedance measurement region;
wherein the first and second timing markers have a different impedance than the impedance measurement region; and
wherein the first and second timing markers have a different direction than the impedance measurement region.

9. A printed circuit board with timing markers defining an impedance measurement region, comprising:
a controlled impedance conductor, the controlled impedance conductor being part of the printed circuit board and comprising,
a first portion;
a second portion;
an impedance measurement region having first and second ends;
a first timing marker; and
a second timing marker;
wherein the first timing marker is coupled between the first portion and the first end of the impedance measurement region, and the second timing marker is coupled between the second portion and the second end of the impedance measurement region;
wherein the first and second timing markers have a different impedance than the impedance measurement region; and
wherein the first and second timing markers have a lower impedance than the impedance measurement region.

10. A printed circuit board with timing markers defining an impedance measurement region, comprising:
a controlled impedance conductor, the controlled impedance conductor being part of the printed circuit board and comprising,
a first portion;
a second portion;
an impedance measurement region having first and second ends;
a first timing marker; and
a second timing marker;
wherein the first timing marker is coupled between the first portion and the first end of the impedance measurement region, and the second timing marker is coupled between the second portion and the second end of the impedance measurement region;
wherein the first and second timing markers have a different impedance than the impedance measurement region; and
wherein the first and second timing markers have a higher impedance than the impedance measurement region.

11. A printed circuit board with timing markers defining an impedance measurement region, comprising:
a controlled impedance conductor, the controlled impedance conductor being part of the printed circuit board and comprising,
a first portion;
a second portion;
an impedance measurement region having first and second ends;
a first timing marker; and
a second timing marker;
wherein the first timing marker is coupled between the first portion and the first end of the impedance measurement region, and the second timing marker is coupled between the second portion and the second end of the impedance measurement region;
wherein the first and second timing markers have a different impedance than the impedance measurement region; and
wherein the first and second timing markers are substantially the same impedance.

12. A printed circuit board with timing markers defining an impedance measurement region, comprising:
a controlled impedance conductor, the controlled impedance conductor being part of the printed circuit board and comprising,
a first portion;
a second portion;
an impedance measurement region having first and second ends;
a first timing marker; and
a second timing marker;
wherein the first timing marker is coupled between the first portion and the first end of the impedance measurement region, and the second timing marker is coupled between the second portion and the second end of the impedance measurement region;
wherein the first and second timing markers have a different impedance than the impedance measurement region; and
wherein the first and second timing markers are different impedance.

* * * * *